United States Patent [19]

Sicignano et al.

[11] Patent Number: 4,845,362
[45] Date of Patent: Jul. 4, 1989

[54] IN SITU DIFFERENTIAL IMAGING AND METHOD UTILIZING A SCANNING ELECTRON MICROSCOPE

[75] Inventors: Albert Sicignano, Mount Kisco; Mehdi Vaez-Iravani, Peekskill, both of N.Y.

[73] Assignee: North American Philips Corporation, New York, N.Y.

[21] Appl. No.: 151,367

[22] Filed: Feb. 2, 1988

[51] Int. Cl.⁴ ............................................. G01N 23/00
[52] U.S. Cl. .................................... 250/310; 250/307; 250/311; 250/397
[58] Field of Search ........... 250/310, 307, 311, 492.23, 250/492.22, 397, 491.1

[56] References Cited

U.S. PATENT DOCUMENTS

| | | | |
|---|---|---|---|
| 4,286,154 | 8/1981 | Okubo et al. | 250/310 |
| 4,288,692 | 9/1981 | Schamber et al. | 250/310 |
| 4,393,309 | 7/1983 | Norioka | 250/310 |
| 4,745,362 | 5/1988 | Burst | 250/310 |

Primary Examiner—Bruce C. Anderson
Assistant Examiner—Michael Aronoff
Attorney, Agent, or Firm—Paul R. Miller

[57] ABSTRACT

The operating characteristics of an SEM apparatus are enhanced by carrying out in situ deflection during electron beam scanning of an object to be examined. Differential signals derived from the in situ deflection are a direct measure of the spatial derivative of any geometric or material variations on the surface of the scanned object.

16 Claims, 2 Drawing Sheets

IN SITU DIFFERENTIAL IMAGING AND METHOD UTILIZING A SCANNING ELECTRON MICROSCOPE

BACKGROUND OF THE INVENTION

This invention relates to high-resolution microscopy and, more particularly, to a scanning electron microscope (SEM) utilized for imaging and measuring purposes.

It is well known that SEMs are employed in a variety of scientific and commercial applications to perform a number of tasks of practical importance. By way of example, SEMs are widely used as a high-resolution monitoring tool in connection with the design, testing and fabrication of microminiature devices such as integrated circuits (ICs).

As the minimum feature size of IC devices has continued to decrease, it has become apparent that the accuracy, sensitivity, contrast and stability of conventional SEMs are often inadequate to meet the critical requirements associated with imaging and measuring features on such devices. Also, the necessity of being able to align IC features in the SEM apparatus is apparent. As feature sizes shrink, the importance of being able to perform this alignment in a simple and direct way with extremely high precision is becoming vital.

Heretofore, various expedients have been resorted to to try to improve the performance of conventional SEMs in certain critical applications such as those mentioned above. These expedients have, for example, included varying the operating parameters of the SEM, often in a trial and error way, to attempt to maximize some property of the signal obtained from the sample under study. More often than not, however, such approaches have at the same time resulted in degrading other important capabilities of the SEM.

In some cases, electronic processing of the signals obtained from the SEM can serve to enhance their suitability for a particular application. But such post-scanning processing is typically limited in its enhancement capabilities and often requires a considerable amount of expensive processing equipment.

With respect to the matter of aligning a sample in the SEM apparatus, this is often done manually by an operator based on visual inspection. This approch has obvious limitations when applied, for example, to sub-micro-size features on IC devices. Further, other alignment approaches based on sophisticated pattern recognition routines also have been found to have practical drawbacks.

Accordingly, efforts have continued by workers skilled in the art directed at trying to improve the aforementioned operating characteristics of SEMs for use in applications of the type mentioned above. It was recognized that these efforts, if successful, could significantly improve the performance of SEMs in general and in particular make them especially attractive for use in connection with the design, testing and manufacture of small-feature-size ICs.

SUMMARY OF THE INVENTION

In accordance with the principles of the present invention, in situ differential signals are obtained from an object examined in an SEM. In this manner, a direct way is provided to monitor local geometric or material variations on the object with high contrast and sensitivity.

In accordance with one feature of applicants' invention, small amplitude high-frequency periodic signals are superimposed on the standard deflection signals employed to scan the beam of an SEM across the surface of an object in the x and/or y directions. In one illustrative embodiment, periodic x-direction signals are superimposed on the standard x-direction deflection signal during scanning of the beam along an x-direction line across the object. Any geometric or material variation on the object defined by a boundary line that form an angle of other than zero degrees with the x-direction line will give rise to an alternating current (AC) signal at the frequency $f_s$ of the superimposed periodic signals. The signal obtained at $f_s$ along the x-direction line at each resolvable point is a direct measure of the spatial derivative of any variation on the object at that point.

In another embodiment of this invention, periodic y-direction signals are superimposed on the standard y-direction deflection signal during scanning of the beam along a y-direction line across the object. Any variation on the object defined by a boundary line that forms an angle of other than zero degrees with the y-direction line will give rise to an AC signal that provides a direct measure of the spatial derivative of any variation on the object along the y-direction line.

In still another embodiment of applicants' invention, periodic x- and y-direction signals are simultaneously superimposed on the standard x- (or y-) direction deflection signal during scanning of the beam along an x- (or y-) direction line across the object. In one illustrative such case, the periodic x- and y-direction signals are selected to be equal in amplitude and frequency but 90 degrees out of phase with respect to each other. This causes the beam to perform local circular rotations along the scanned line. Such a scanning pattern provides a sensitive basis for generating in situ differential signals representative of local variations on the object defined by boundary lines extending in the x and/or y directions.

In another illustrative such case, the simultaneously superimposed x- and y-direction periodic signals are selected to be equal in frequency and phase but variable in relative amplitude. This permits the scanning beam to be tailored to be particularly sensitive to boundary or edge variations extending in specified directions.

In yet another embodiment of this invention, a periodic variation of the size of the electron beam at the surface of the object being scanned is carried out during x- or y-direction scanning. As in the aforementioned cases, this provides a basis for generating signals representative of the derivative of variations in the scanned object. This can be carried out, for example, simply by selectively varying the focusing current supplied to the magnetic imaging lens of a standard SEM.

In an alternative embodiment of applicants' invention, the x- and/or y-direction deflections of the electron beam are carried out in a conventional manner without superimposing thereon any electrical signals or varying the size of the electron beam as described above. In that embodiment, the object itself is periodically deflected during scanning of the beam across the object. This can be done, for example, by mounting the object on a table capable of movement in the x, y and z directions and mechanically driving the table in one or more of these directions with a piezo-electric assembly.

Applicant's in situ differential technique provides a direct and systematic basis for accurately aligning the beam of an SEM with respect to features on an object to be scanned. Thus, for example, since the x derivative of a feature boundary is maximized when the boundary edge is perpendicular to the x direction, alignment of the feature can be achieved by ensuring that the signal at $f_s$ due to local periodic x deflection is maximized as the boundary is scanned in a raster fashion in the x direction. The object (or the beam) can then be rotated if required to correct for any deviation from orthogonality. Alternatively, if periodic y-direction signals are superimposed on the main x-direction deflection signals, alignment is achieved by ensuring that the signal at $f_s$ is minimized as the boundary edge is scanned.

In summary, applicants' inventive apparatus is adapted to form an electron beam that is designed to be scanned over the surface of an object which is to be examined for geometric or material variations. The object is supported in the path of the beam, and the apparatus scans the beam along a specified direction over the surface of the object. During scanning, the apparatus superimposes an in situ deflection on the relative motion that occurs between the scanning beam and the surface of the object. In regions of the object where variations exist, the apparatus detects the occurence of differential signals arising from the in situ deflection.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
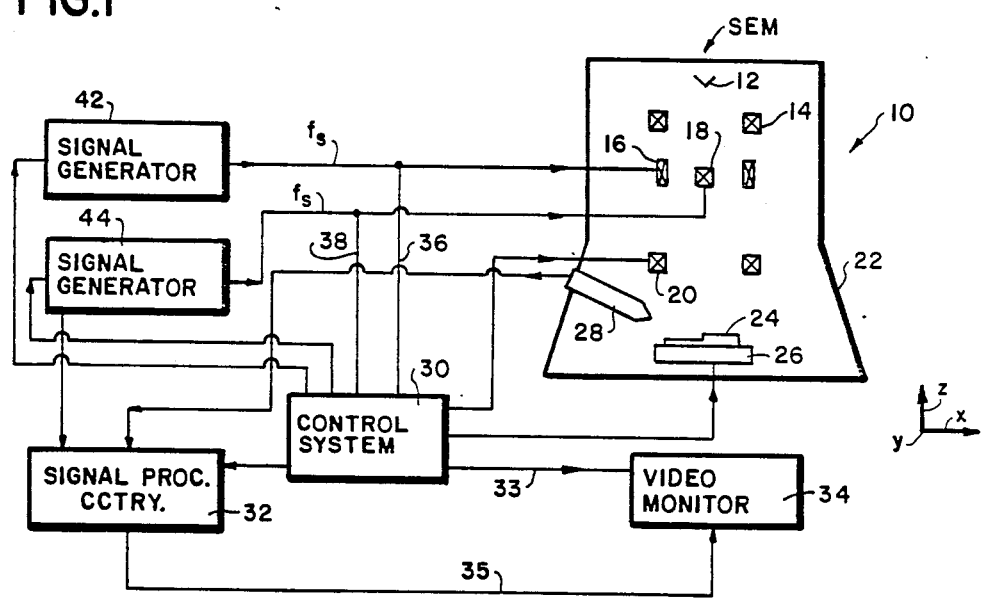
FIG. 1 is a simplified schematic depiction of a specific illustrative embodiment made in accordance with the principles of applicants' invention.

FIG. 1 shows in simplified form some of the components of an SEM apparatus 10. The apparatus 10 includes a conventional electron source 12, a standard electromagnetic condensing lens 14, an x-direction deflection assembly 16, a y-direction deflection assembly 18 and an electromagnetic imaging lens 20. All of these components are shown disposed within evacuated envelope 22.

The electron beam of the apparatus 10 shown in FIG. 1 is designed to be scanned in the depicted x and y directions over the surface of an object 24 that is supported on a table 26. By way of a specific illustrative example, the object 24 is assumed to be a semiconductor wafer. Selected portions of the wafer surface are to be successively examined for geometric or material variations.

It is known that various standard detection modalities may be utilized in an SEM. Thus, for example, secondary-electron production or back-scattered electrons or other known phenomena arising from impingement of an electron beam on an object may be employed as the basis for monitoring the interaction between the beam and the object 24. Herein, for illustrative purposes, it will be assumed that secondary electrorn production from the object 24 is to be detected. For that purpose, the apparatus 10 includes a secondary-electron detector 28. In turn, the output of the detetor 28 is applied to signal processing circuitry 32. The nature and function of the circuitry 32 will be specified later below.

Control system 30 shown in FIG. 1 is designed to supply appropriate timing and scanning signals via bus 33 to a standard video monitor 34. The actual signals to be displayed on the monitor 34 are supplied thereto by the circuitry 32 via lead 35. These signals are representative of geometric and material variations on the scanned object 24.

The control system 30 also supplies standard x- and-/or y-direction scanning signals to the deflection assemblies 16 and 18 of the SEM apparatus 10. These standard scanning signals are supplied thereto via leads 36 and 38, respectively. As described later below, these signals can be designed to implement either analog or digital scanning across the surface of the object 24.

In accordance with one feature of applicants' inventive principles, additional signals are superimposed on the aforementioned standard x- and/or y-direction scanning signals supplied to the deflection assemblies 16 and 18 by the control system 30. Illustratively, these additional signals are supplied at a frequency $f_s$ by signal generators 42 and 44. The generator 42 supplies signals to the x-direction deflection assembly 16. These signals are, for example, superimposed on the standard x-direction scanning signals supplied by the system 30 to the assembly 16. Similarly, the generator 44 supplies signals to the y-direction deflection assembly 18. Illustratively, these signals are superimposed on the standard y-direction scanning signals supplied by the system 30 to the assembly 18.

Alternatively, signals supplied by the generator 42 can be supplied to the x-direction deflection assembly 16 while standard y-direction scanning signals are supplied by the control system 30 to the y-direction deflection assembly 18. Similarly, signals supplied by the generator 44 can be supplied to the y-direction deflection assembly 18 while standard x-direction scanning signals are supplied by the system 30 to the x-direction deflection assembly 16. These alternative combinations of superimposed signals are, for example, particularly advantageous for alignment purposes.

Figure 2:
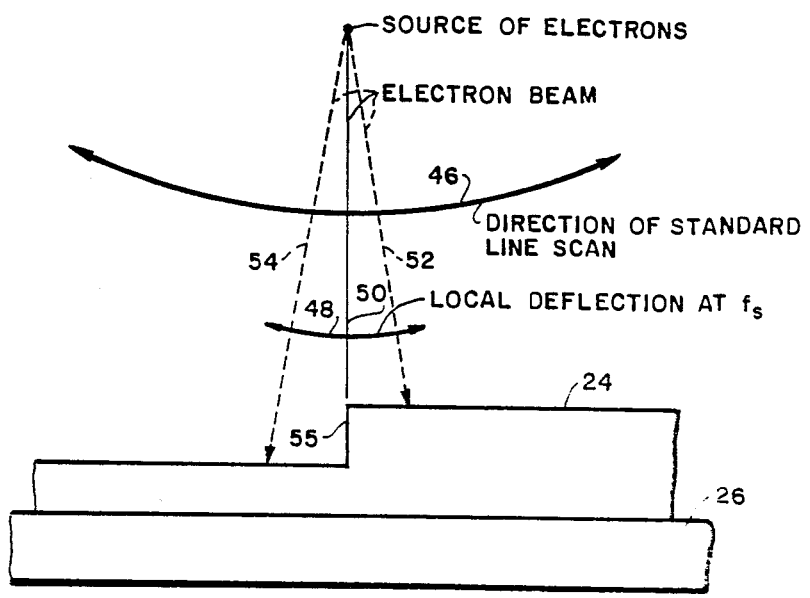
FIG. 2 represents the manner in which one mode of beam scanning is carried out in the FIG. 1 arrangement.

FIG. 2 is helpful in understanding the manner in which the surface of the object 24 is scanned by an electron beam deflected by the aforedescribed superimposed signals. Line 46 represents standard scanning of the object 24 from left to right. At the surface of the object 24, this scanning constitutes, for example, standard x-direction scanning. While this standard scanning is proceeding in an analog or digital fashion from left to right, a so-called local deflection of the beam is also occurring. One specific type of such local deflection superimposed on the standard scan is represented by line 48. Thus, while the position of the beam as determined by the standard scanning signal is nominally indicated by line 50, a relatively high-frequency x-direction scanning of the beam at the frequency $f_s$ occurs. This high-frequency scanning of the beam about the line 50 causes the beam to rapidly move between dashed lines 52 and 54 while the beam position as determined by the standard scanning signal remains approximately in line with topographical step 55 on the object 24. This is the basis for obtaining an output signal centered about the frequency $f_s$. This output signal is proportional to the slope of the local feature (e.g. the step 55) being scanned.

In accordance with applicants' invention, the superimposed signal at the frequency $f_s$ constitutes a periodic signal. A square wave would be ideal. In practice, a sine wave is advantageously employed. The amplitude of the superimposed signal is chosen such that local movement or oscillation of the electron beam on the surface of the object is less than the corresponding resolution spot diameter displayed on the monitor 34 (FIG. 1). In other words, the maximum local displacement (the deflection amplitude) of the electron beam due to the superimposed signal is selected to be within a video pixel diameter. In this way, the local beam excursions at $f_s$ do not alter the resolution of the displayed image.

The instantaneous AC signal derived from the aforedescribed superimposed signal is directly related to the spatial derivative of the geometric or material properties at the locality under examination on the surface of an object. This is so if the size of the locality equals or is less than the corresponding size of a displayed video pixel. Moreover, the signal so obtained is a measure of the true spatial derivative of the object if the deflection frequency $f_s$ is chosen such that any locality corresponding to a pixel is interrogated at least twice by the electron beam. If this condition obtains, operation in the herein-described in situ diferential mode is then independent of the frequency of the occurrence of object features. In practice, any higher frequency within the detection and signal processing capabilities of the overall system may be utilized.

By way of a specific illustrative example, assume that about 40 microseconds is the time required by a conventionally scanned beam (without a superimposed signal) to traverse a region on the object surface that corresponds to a video pixel. In accordance with applicants' invention, the period of oscillation of the superimposed signal should accordingly be less than aproximately 20 micro seconds. In other words, in this particular example the frequency $f_s$ of the superimposed signal should be at least about 50 kiloHertz. This ensures that at least two oscillations of the superimposed signal will occur during the scanning time required to traverse the aforespecified region on the surface of the object.

Figure 3A:
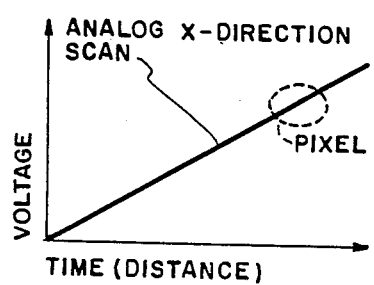
FIGS. 3 and 4 each show a periodic signal superimposed on a main deflection signal in the manner contemplated by applicants' inventive principles.
Figure 3B:
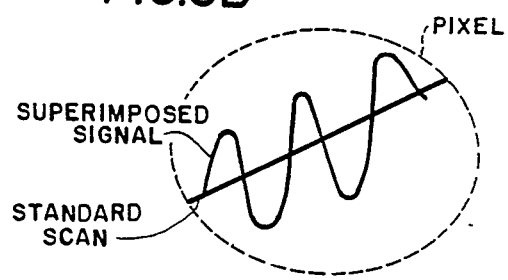
Figure 4A:
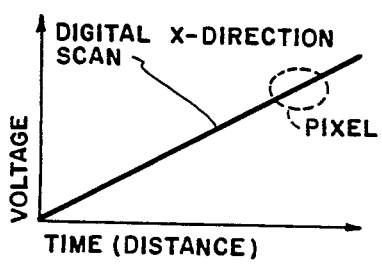
Figure 4B:
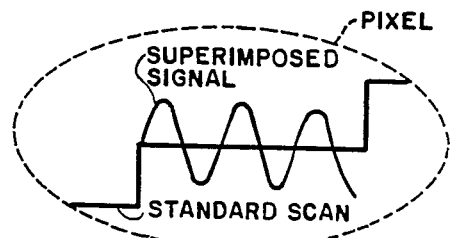

Some of the aforespecified criteria with respect to the superimposed signals are illustrated in FIGS. 3 and 4. FIG. 3 represents a standard x-direction analog scan on which relatively high-frequency periodic signals are superimposed. FIG. 4 shows a standard x-direction digital scan on which relatively high-frequency periodic signals are also superimposed. In each case, it is apparant that the maximum amplitude of the superimposed signal has been maintained within the corresponding pixel element, so as not to alter the displayed image resolution. Similarly, it is evident from FIGS. 3 and 4 that at least two full cycles of the superimposed signal occur within the locality correponding to a pixel.

Figure 5:
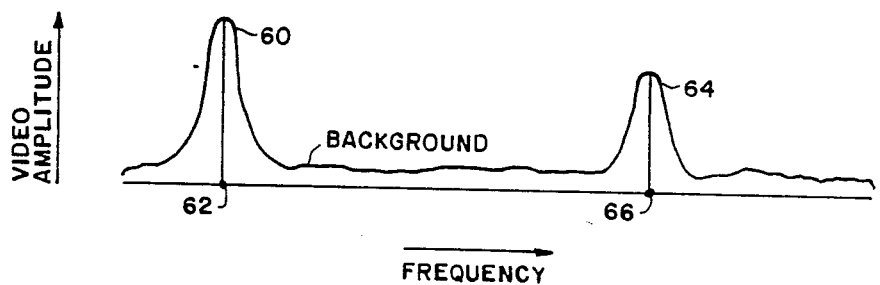
FIG. 5 illustrates output signals of the type generated in the FIG. 1 arrangement.

FIG. 5 shows the spectrum of the output signal obtained from the SEM apparatus 10 (FIG. 1) as a result of scanning a geometric or material variation on the surface of the object 24. Envelope 60 centered about direct-current (DC) point 62 represents the conventional output usually obtained from such a scan. Envelope 64 centered about point 66 represents the output attributable to the aforedescribed superimposed signal. The point 66 corresponds to the frequency $f_s$.

In accordance with the principles of applicants' invention, only the signal envelope 64 is utilized for display purposes on the monitor 34. The conventional signal envelope 60 around DC point 62 is in effect discarded. By so doing, many undesirable low-frequency phenomena such as mechanical vibrations and electron-source variations are eliminated from the displayed output or at least substantially reduced. Also, by removing DC-type effects from the output, the entire dynamic range of the video monitor can be devoted to displaying only differential changes. Further, in some cases the overall signal-to-noise ratio of the system can be improved by slowing the main or standard scan while still obtaining a good differential signal at the frequency $f_s$.

Illustratively, the envelope 60 represented in FIG. 5 is removed by the circuitry 32 shown in FIG. 1. By way of example, the circuitry 32 comprises a conventional lock-in amplifier that supplies an output signal only at a prescribed frequency or within a prescribed band of frequencies, as determined by a reference signal at the frequency $f_s$ applied to the circuitry 32 from the signal generator 44. Alternatively, the circuitry 32 may simply comprise a standard bandpass filter centered on $f_s$, combined with conventional detecting and amplifying circuitry.

In accordance with applicants' invention, in situ differential scanning can also be achieved without superimposing electrical signals on the standard scanning signals. This can be done, for example, by periodically altering the spot size of the electron beam at the surface of the object 24. As indicated in FIG. 1, this can be done simply by selectively varying the current supplied by the control system 30 to the imaging lens 20, thereby periodically altering the focal length of the SEM apparatus 10. In this mode of operation, an AC signal occurs whenever a local variation on the object is encountered. This signal peaks as the diameter of the electron beam goes through its smallest size.

The mode of operation described in the paragraph immediately above is operationally equivalent to sinusoidally moving the object 24 up and down through the geometric focal plane of the SEM apparatus 10. In practice, such movement can be realized by including a piezo-electric assembly in the table 26 and applying control signals thereto from the system 30 to move the table 26 up and down in the z direction indicated in FIG. 1.

Additionally, the piezo-electric assembly included in the table 26 can also be designed to periodically deflect the table 26 and thereby the object 24 in the x and/or y directions. In that way, the same result achieved by superimposing electrical signals on the x- and/or y-direction scans can be obtained by mechanically vibrating the object in accordance with the aforementioned frequency and amplitude criteria.

Further, although much of the attention herein has been directed to superimposing an x-direction signal on a standard x-direction scan, it is emphasized that applicants' inventive principles apply to various other modes of operation. As indicated earlier, local y-direction deflection of the beam can be superimposed on the standard y-direction scan signal to achieve sensitivity to boundary edges that lie along or parallel to the x axis. Also, local circular deflection of the beam can be achieved by simultaneously superimposing two 90-degree-out-of-phase sinusoids of equal amplitude and frequency on the standard x- and y-direction scan signals, respectively. This provides a basis for sensing local variations defined by edges extending along or parallel to the x and/or y directions. In another feasible case, in-phase equal-frequency signals can be simultaneously superimposed on the standard x- and y-direction scan signals, respectively. As noted earlier above, this permits the scanning beam to be tailored to be particularly sensitive to edge variations extending in specified directions. In other words, the resultant direction of the super-imposed signals can be selected to be orthogonal to a particular edge variation to be scanned.

Also, as mentioned earlier above, applicants' in situ differential scanning technique is well suited for alignment purposes. By way of example, the technique provides a direct and accurate method for aligning IC features in an SEM apparatus. Illustratively, feature alignment can be carried out by electronically monitoring the $f_s$ signal while raster scanning the feature. Rotation of the sample with respect to the beam can be designed to occur automatically as indicated by the $f_s$ signal.

Finally, it is to be understood that the above-described techniques and arrangements are only illustrative of the principles of the present invention. In accordance with these principles, numerous modifications and alternatives may be devised by those skilled in the art without departing from the spirit and scope of the invention.

What is claimed is:

1. Apparatus comprising
   means for forming an electron beam adapted to be scanned over the surface of an object that is to be examined for geometric or material variations,
   means for scanning said electron beam along a specified direction over the surface of said object,
   means for supportng said object in the path of said scanning electron beam,
   means for superimposing during scanning a periodic in situ deflection on the relative motion tht exists between said scanning electron beam and the surface of said object,
   means for detecting the occurrence of differential signals arising from said in situ deflection in regions of said object where variations occur, and
   means for displaying said differential signals,
   wherein at least two full oscillations of said in situ deflection occur during the time in which the scanning electron beam traverses a portion of the object surface corresponding to a pixel of said displaying means, and wherein the peak-to-peak amplitude of said oscillations is less than the corresponding resolution spot size of said displaying means.

2. Apparatus as in claim 1, wherein the surface of said supporting means lies in a plane defined by orthogonally disposed x and y axes, and wherein said specified scanning direction is along or parallel to one of said axes.

3. Apparatus as in claim 2, wherein said scanning means scans said electron beam along or parallel to said x axis, and wherein said superimposing means comprises means for superimposing electrical signals on said scanning.

4. Apparatus as in claim 3, wherein said electrical signals cause x-direction deflection of said electron beam during x-direction scanning.

5. Apparatus as in claim 3, wherein said electrical signals cause y-direction deflection of said electron beam during x-direction scanning.

6. Apparatus as in claim 2, wherein said scanning means scans said electron beam along or parallel to said y axis, and wherein said superimposing means comprises means for superimposing electrical signals on said scanning.

7. Apparatus as in claim 6, wherein said electrical signals cause y-direction deflection of said electron beam during y-direction scanning.

8. Apparatus as in claim 6, wherein said electrical signals cause x-direction deflection of said electron beam during y-direction scanning.

9. Apparatus as in claim 3, wherein said electrical signals comprise signals to cause x-direction deflection of said electron beam during scanning and simultaneously applied equal-frequency equal-amplitude 90-degree-out-of-phase signals to cause y-direction deflection of said electron beam.

10. Apparatus as in claim 3, wherein said electrical signals comprise signals to cause x-direction deflection of said electron beam during scanning and simultaneously applied equal-frequency in phase signals to cause y-direction deflection of said electron beam, and wherein the relative amplitude of said x-direction and y-direction deflection signals is variable.

11. Apparatus as in claim 6, wherein said electrical signals comprise signals to cause x-direction deflection of said electron beam during scanning and simultaneously applied equal-frequency, equal-amplitude, 90-degree-out-of-phase signals to cause y-direction deflection of said electron beam.

12. Apparatus as in claim 6, wherein said electrical signals comprise signals to cause x-direction deflection of said electron beam during scanning and simultaneously applied equal-frequency in-phase signals to cause y-direction deflection of said electron beam, and wherein the relative amplitude of said x-direction and y-direction deflection signals is variable.

13. Apparatus as in claim 2, wherein said superimposing means comprises means for varying during scanning the size of the electron beam at the surface of said object.

14. Apparatus as in claim 13, further including an imaging lens for said electron beam, wherein said means for varying the size of the electron beam at the surface of said object includes means for applying variable electrical signals to said imaging lens.

15. Apparatus as in claim 13, wherein said means for varying the size of the electron beam at the surface of said object includes means for mechanically moving said supporting means along or parallel to a z axis, whre the z axis is perpendicular to said x-y plane.

16. Apparatus as in claim 2, wherein said superimposing means comprises means for superimposing mechanical deflections on said supporting means along or parallel to the x and/or y axes as scanning occurs along or parallel to one of the x and y axes.

* * * * *